United States Patent
Odiz et al.

(10) Patent No.: US 10,372,858 B2
(45) Date of Patent: Aug. 6, 2019

(54) DESIGN-FOR-TESTABILITY (DFT) INSERTION AT REGISTER-TRANSFER-LEVEL (RTL)

(71) Applicant: Synopsys, Inc., Mountain View, CA (US)

(72) Inventors: Eyal Odiz, Los Altos Hills, CA (US); Janet L. Olson, Saratoga, CA (US); Mukund Sivaraman, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 76 days.

(21) Appl. No.: 15/445,689

(22) Filed: Feb. 28, 2017

(65) Prior Publication Data

US 2018/0246996 A1    Aug. 30, 2018

(51) Int. Cl.
*G06F 17/50* (2006.01)

(52) U.S. Cl.
CPC ........ *G06F 17/505* (2013.01); *G06F 17/5072* (2013.01); *G06F 2217/14* (2013.01)

(58) Field of Classification Search
CPC ............. G06F 17/5022; G06F 2217/14; G06F 17/505; G06F 17/5027; G06F 17/504; G06F 17/5081; G01R 31/31704; G01R 31/318583; G01R 31/318314; G01R 31/318547; G01R 31/3177; G01R 31/2834; G01R 31/31725

USPC .......................... 716/106, 111, 118–119, 136
See application file for complete search history.

(56) References Cited

U.S. PATENT DOCUMENTS

| | | | | |
|---|---|---|---|---|
| 7,926,012 B1* | 4/2011 | Parimi | ................. | G06F 17/505 324/76.66 |
| 8,037,377 B1* | 10/2011 | Chia | ................ | G01R 31/31716 714/712 |
| 2005/0273683 A1* | 12/2005 | Cote | .............. | G01R 31/318583 714/726 |
| 2009/0032899 A1* | 2/2009 | Irie | ....................... | G06F 17/505 257/499 |
| 2017/0205464 A1* | 7/2017 | Oomman | ....... | G01R 31/318583 |
| 2018/0128877 A1* | 5/2018 | Pradeep | ........... | G01R 31/31707 |

* cited by examiner

*Primary Examiner* — Nghia M Doan
(74) *Attorney, Agent, or Firm* — Park, Vaughan, Fleming & Dowler LLP; Laxman Sahasrabuddhe

(57) ABSTRACT

Systems and techniques are described for producing a synthesized IC design that includes design-for-testability (DFT) circuitry. A register-transfer-level (RTL) representation of an IC design can be received, wherein the RTL representation includes functional logic. Next, DFT logic can be added to the RTL representation, and DFT placement guidance for placing the DFT logic can be generated. Synthesis can be performed on the RTL representation to obtain the synthesized IC design, wherein during synthesis, (1) the functional logic and the DFT logic can be placed, wherein the DFT logic is placed based on the DFT placement guidance, (2) scan chains can be inserted and placed, and (3) the DFT logic can be electrically connected with the scan chains.

14 Claims, 6 Drawing Sheets

DESIGN-FOR-TESTABILITY (DFT) INSERTION AT REGISTER-TRANSFER-LEVEL (RTL)

TECHNICAL FIELD

This disclosure relates to integrated circuits (ICs). More specifically, this disclosure relates to techniques and systems for producing a synthesized IC design that includes design-for-testability (DFT) circuitry.

BACKGROUND

Related Art

Advances in process technology and an almost unlimited appetite for consumer electronics have fueled a rapid increase in the size and complexity of IC designs. The importance of testing in IC designs cannot be over-emphasized. Indeed, it would be impossible to use IC designs in mission-critical devices and applications if IC designs had not been thoroughly tested.

Modern IC designs usually include circuitry that is specifically designed for testing the IC designs. FIG. 1A illustrates an example of test circuitry that can be included in an IC design and that can be used to test the IC design in accordance with some embodiments described herein. IC design 100 includes test input pins 102, test output pins 104, decompression logic 106, M scan chains labeled 0 through M−1, and compression logic 108. Of course, IC design 100 also includes functional logic which implements the desired functionality of IC design 100, but the functional logic has not been shown in FIG. 1A to keep the figure free of clutter.

An Automatic Test Pattern Generation (ATPG) engine can be used to generate a sequence of compressed test vectors which can be provided to decompression logic 106 through test input pins 102, and decompression logic 106 can output a sequence of uncompressed test vectors. The sequence of uncompressed test vectors can be scanned into the M scan chains via scan chain inputs (SCI) 110. The registers in the scan chains can supply the desired test inputs to the functional logic. Once the test data has been scanned into the scan chains, the IC design can be cycled through one or more clock cycles, and the outputs from the functional logic can be captured by the registers in the scan chains. Next, the captured response data (i.e., the captured outputs from the functional logic) can be scanned out as a sequence of response vectors, and the sequence of response vectors can be provided to compression logic 108 via scan chain outputs (SCO) 112. Compression logic 108 can compress the sequence of response vectors and output a sequence of compressed response vectors through test output pins 104. The sequence of compressed response vectors outputted through test output pins 104 can be analyzed to determine whether or not IC design 100 is functioning as desired.

FIG. 1B illustrates a single register stage in a scan chain in accordance with some embodiments described herein. Register stage 150 includes flip-flop 152 and multiplexer 154, which can be implemented using one or more cells. A scan chain includes a plurality of register stages coupled in series, i.e., the output (e.g., output 164) of a given register stage is electrically connected with the scan-in/scan-out multiplexer input (e.g., input 156) of the next register stage. Note that the electrical connection between the output of a given register stage and the scan-in/scan-out multiplexer input of the next register stage can pass through one or more inverters and/or buffers. Additionally, the functional output and the scan output may or may not be the same, i.e., some flip-flops may have two separate outputs: one that is used to electrically connect with the functional logic, and one that is used to electrically connect with the multiplexor input of the next register stage in a scan chain. Input 156 of multiplexer 154 can receive scan-in data from decompression logic 106 (when register stage 150 is the first register stage in the scan chain) or scan-in/scan-out data from the previous register stage in the scan chain. Output 164 can provide scan-in/scan-out data to the next register stage in the scan chain or scan-out data to compression logic 108 (when register stage 150 is the last register stage in the scan chain). Multiplexer select input 160 can be used to couple either input 156 or input 158 with output 162. Specifically, input 156 is coupled with output 162 when data is being scanned into the scan chain or is being scanned out of the scan chain. On the other hand, input 158 is coupled with output 162 when flip-flop 152 is being used in the normal functional mode or to capture the test response from the functional logic.

The test circuitry (e.g., decompression logic, compression logic, scan chains, etc.) in an IC design is not an insignificant part of the IC design, e.g., test circuitry can sometimes occupy up to 10% of the total area of an IC design. Existing IC design tools and IC design flows that produce IC designs that include test circuitry can have long runtimes and/or poor quality of results (QoR).

SUMMARY

Some embodiments described herein provide techniques and systems for producing a synthesized IC design that includes DFT circuitry. During operation, the embodiments can receive a register-transfer-level (RTL) representation of the IC design. Next, the embodiments can add DFT logic to the RTL representation, and generate DFT placement guidance for placing the DFT logic. The embodiments can then perform synthesis on the RTL representation to obtain the synthesized IC design. Specifically, performing synthesis on the RTL representation can comprise performing a set of operations that include: (1) placing the functional logic and the DFT logic, wherein the DFT logic is placed based on the DFT placement guidance, (2) inserting and placing scan chains, and (3) electrically connecting the DFT logic with the scan chains.

Embodiments described herein have faster runtimes and/or produce better QoR when compared to existing approaches because, among other things, the embodiments add the DFT logic to the RTL representation prior to placement, and then place the DFT logic based on the DFT placement guidance. Additionally, because the DFT logic is added to the RTL representation, the synthesis tool is aware of the power intent related to the DFT logic during synthesis. As a result, the placement of the DFT logic is consistent with the power intent for the IC design, which results in improved QoR.

In some embodiments, electrically connecting the DFT logic with the scan chains can comprise: (1) electrically connecting outputs of decompression logic with inputs of the scan chains, and (2) electrically connecting outputs of the scan chains with inputs of compression logic.

In some embodiments, prior to adding the DFT logic to the RTL representation, the RTL representation does not include any DFT logic and also does not include any scan chains (i.e., the flip-flops in the functional logic that will eventually form the scan chains are not electrically connected in a series fashion in the RTL representation).

In some embodiments, prior to performing synthesis on the RTL representation, the RTL representation does not include physical location information for the functional logic or the DFT logic.

In some embodiments, generating the DFT placement guidance for placing the DFT logic can comprise: (1) adding a set of anchor points to the IC design, and (2) electrically connecting the DFT logic with the set of anchor points. In some embodiments, each anchor point can be a dummy cell having zero area.

In some embodiments, after placing the functional logic and the DFT logic, but prior to inserting and placing scan chains, the embodiments can (1) electrically disconnect the DFT logic from the set of anchor points, and (2) remove the set of anchor points from the IC design.

DETAILED DESCRIPTION

Figure 1A:
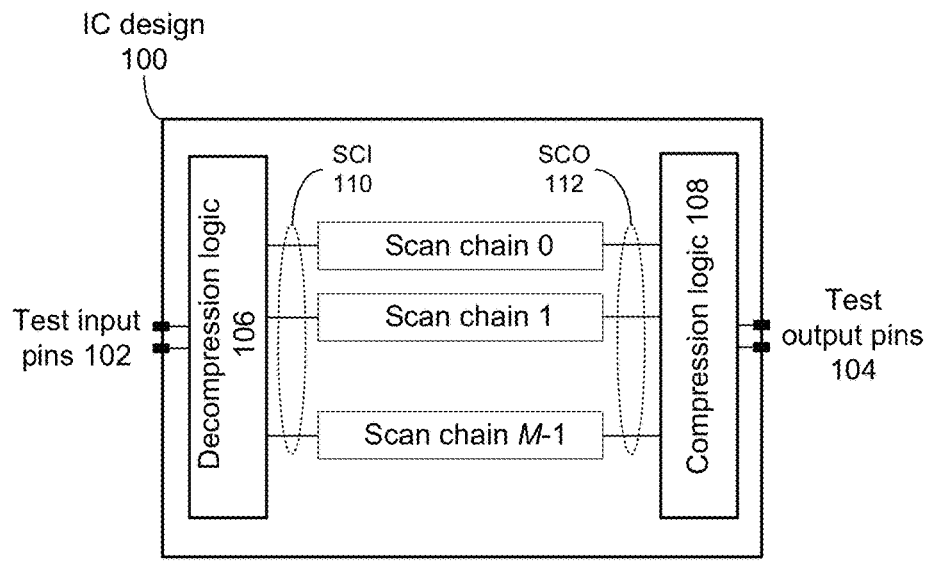
FIG. 1A illustrates an example of test circuitry that can be included in an IC design and that can be used to test the IC design in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of IC Design and Manufacturing

IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results (QoR). Some examples of IC design steps and the associated software tools are described below. These examples are for illustrative purposes only and are not intended to limit the embodiments to the forms disclosed.

Some IC design software tools enable IC designers to describe the functionality that the IC designers want to implement. These tools also enable IC designers to perform what-if planning to refine functionality, check costs, etc. During logic design and functional verification, the hardware description language (HDL), e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. Some embodiments described herein can be used in this stage, i.e., during synthesis and design for test. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

DFT Insertion at RTL

Figure 1B:
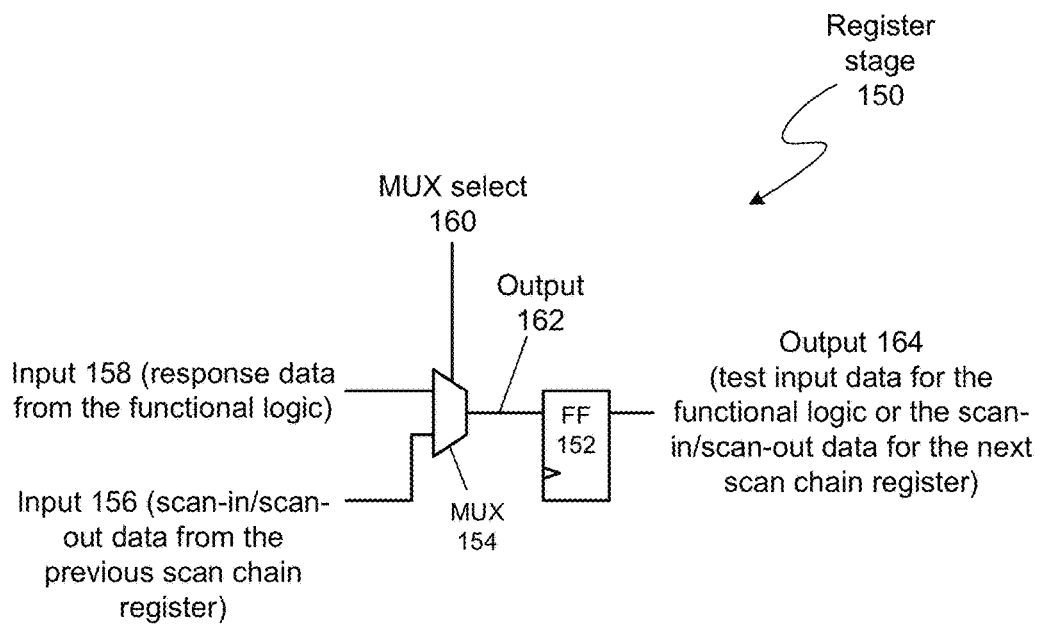
FIG. 1B illustrates a single register stage in a scan chain in accordance with some embodiments described herein.

As explained with reference to FIGS. 1A and 1B, the test circuitry in an IC design can include scan chains and other test circuitry (e.g., the other circuitry can include decompression logic, compression logic, circuitry to provide a test clock signal to the scan chain registers, etc.). In this disclosure, the term "DFT logic" refers to the decompression logic (e.g., decompression logic 106 shown in FIG. 1A) and the compression logic (e.g., compression logic 108 shown in FIG. 1A). In this disclosure, the term "scan chain" (e.g., any one of the scan chains labeled 0 through M−1 in FIG. 1A) refers to a series coupling between a plurality of register stages (e.g., register stage 150 shown in FIG. 1B). Note that the functional logic may already include the flip-flops that will eventually form the scan chains, e.g., flip-flop 152 shown in FIG. 1B. A scan chain is created when the flip-flops in the IC design are electrically coupled in series as explained with reference to FIG. 1B. In this disclosure, the term "functional logic" refers to the circuitry in the IC design that performs the functions and/or computations that the IC design is intended to perform. For example, functional logic can include combinational logic, sequential logic (which can include the flip-flops that will form the scan chains), clock trees, etc. However, the term "functional logic," as it is used in this disclosure, does not include DFT logic and also does not include scan chains. For example, in FIG. 1B, flip-flop 152 can be part of the functional logic. However, multiplexor 154 and the electrical connections that couple the flip-flops in series are not part of the functional logic.

Figure 2:
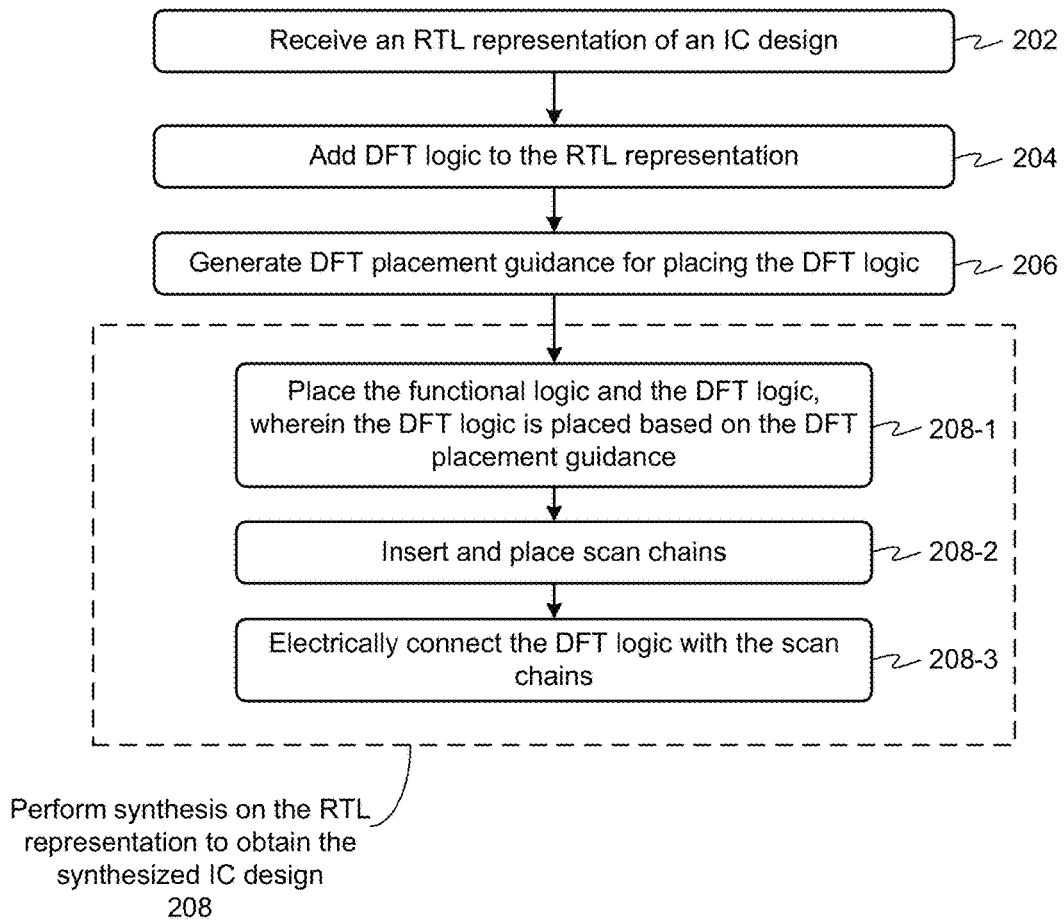
FIG. 2 illustrates a process for producing a synthesized IC design that includes DFT circuitry in accordance with some embodiments described herein.

FIG. 2 illustrates a process for producing a synthesized IC design that includes DFT circuitry in accordance with some embodiments described herein. The process can begin by receiving an RTL representation of the IC design (step 202). RTL is an abstraction level that describes an IC design in terms of the flow of data signals between registers, and the logical operations performed on those data signals. The phrase "register transfer level" refers to the fact that an RTL representation focuses on describing the "transfer" of data signals between "registers." In some embodiments, the RTL representation received in operation 202 includes functional logic, but does not include DFT logic and also does not include scan chains.

An IC design can be represented using different data formats or languages as the IC design progresses through an IC design flow, wherein the different data formats or languages represent the IC design at different levels of abstraction. In general, higher levels of abstraction contain fewer details of the IC design when compared with lower levels of abstraction. Typically, the IC design is described at a high level of abstraction in the early stages of the IC design flow, and the level of abstraction becomes progressively lower as the IC design moves through the IC design flow.

For example, toward the beginning of the IC design flow, an IC design can be described at a high level of abstraction by using an HDL which describes the functionality of the IC design. Next, the HDL can be converted into an RTL representation by using a process called elaboration. The RTL representation implements the functionality that was described in the HDL code by using logic gates (e.g., AND gates, OR gates, etc.) and registers. The HDL and RTL representations contain logical information but usually do not contain physical information, e.g., information about the placement of the gates, the areas of the gates, the leakage power, the width and lengths of the physical wires that electrically connect the gates and registers, or the geometric shapes that will be printed on the wafer.

As the IC design progresses through the IC design flow, these pieces of information—placement, power, area, timing, routing information, actual geometric shapes, etc.—are added to the representation. Toward the end of the IC design flow, the IC design can be represented in a low level of abstraction by using a data format or language such as GDSII or OASIS, which provides detailed information of the actual geometric shapes that are to be printed on the wafer.

Figure 3A:
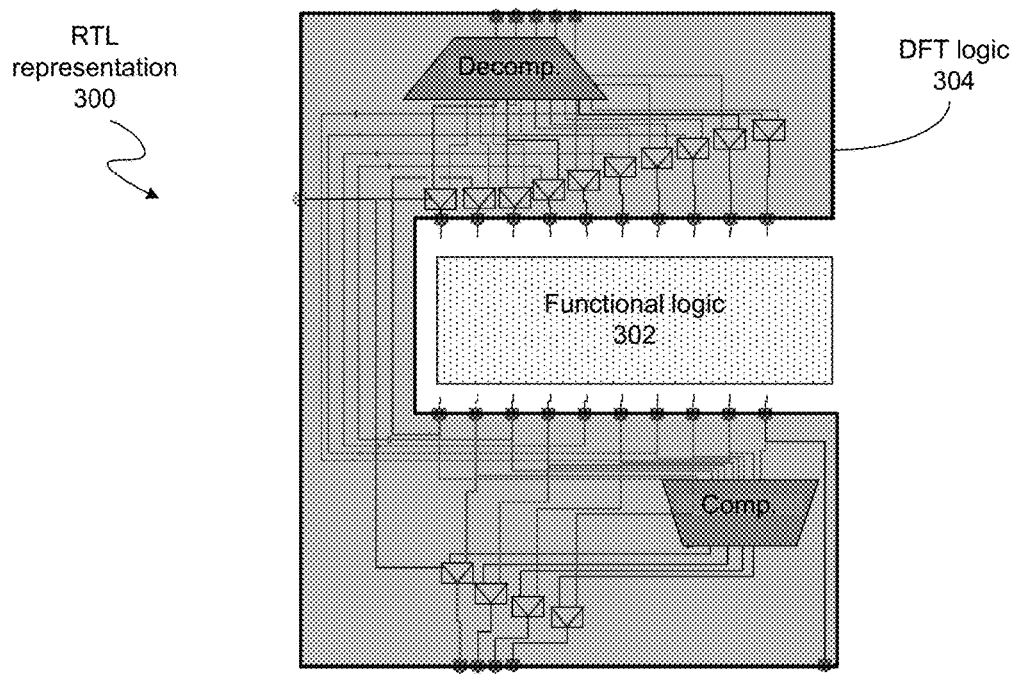
FIG. 3A illustrates an RTL representation after DFT logic has been added in accordance with some embodiments described herein.

Referring back to FIG. 2, the process can add DFT logic to the RTL representation (step 204). FIG. 3A illustrates an RTL representation after DFT logic has been added in accordance with some embodiments described herein. Before step 204, RTL representation included functional logic 302 only. In step 204, the process added DFT logic 304, thereby producing RTL representation 300. When DFT logic is added in step 204, the DFT logic is electrically connected to the test input and output pins because these pins exist in the IC design, but the DFT logic is not electrically connected to the scan chain inputs and outputs because the scan chains do not exist in the IC design yet (specifically, the flip-flops that will eventually form the scan chains may already exist in the IC design, but the scan chains will be inserted or created later during synthesis by electrically connecting the flip-flops in series).

Figure 3B:
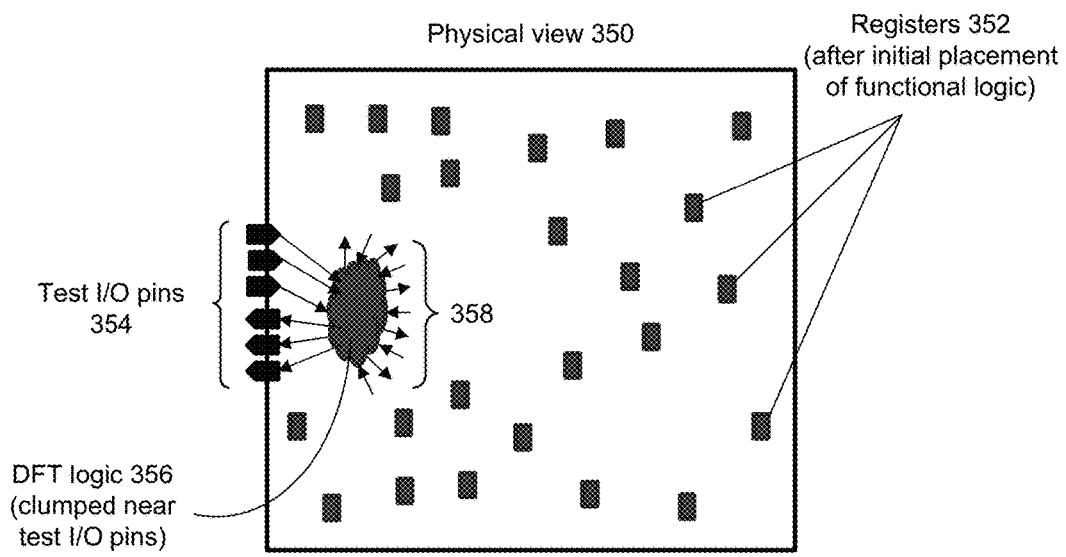
FIG. 3B illustrates a physical view after an initial placement operation is performed on the RTL representation in accordance with some embodiments described herein.

If placement is performed after step 204 without providing any DFT placement guidance to the placer, then the placer will not know how to properly place the DFT logic in the circuit. This is because the DFT logic is not electrically connected to the scan chains. For example, the placer may clump the DFT logic near the test input and output pins, which is not the ideal placement for the DFT logic. For example, FIG. 3B illustrates a physical view after an initial placement operation is performed on the RTL representation in accordance with some embodiments described herein. In physical view 350, the small rectangles represent registers, e.g., registers 352, in the functional logic after initial placement is performed. Note that the placer clumped DFT logic 356 near test I/O pins 354. This is why, in step 206, the process generates DFT placement guidance for placing the DFT logic. Note that it is not advisable to create scan chains and electrically connect the DFT circuitry to the scan chains in the RTL representation because the RTL representation does not contain placement information. Creating scan chains by electrically connecting the flip-flops in series and electrically connecting the DFT circuitry to the scan chains without knowing where the scan chain flip-flops will be located can create serious placement, routing, and/or timing convergence problems during synthesis.

As mentioned above, the functionality of an IC can be specified by using HDL code. In this disclosure, the term "elaboration" refers to a process of constructing a network of logic gates (or "gates" for short) and registers that implements the functionality specified in the HDL code (this network of gates and registers is the RTL representation). At a later point in the IC design flow, each gate in the elaborated IC design (i.e., each gate in the RTL representation) is implemented using a cell or a network of cells which performs the logical function of the gate. A logic gate (or a "gate" for short) is an abstract model of a circuit in a manufactured IC that performs a logical operation or a logical function (e.g., "AND," "OR," "XOR," "4-to-1 multiplexer," etc.). The characteristics of the actual physical circuit that is being modeled by the gate, e.g., the power consumption (e.g., leakage power and dynamic power), the speed (e.g., delay and transition behavior), the size (e.g., area), etc., are determined by the cell that is used for implementing the gate.

An IC design can be manufactured using different semiconductor manufacturing technologies, and each semiconductor manufacturing technology can correspond to one or more cell libraries that can be used by an IC design software tool. Each cell in a cell library contains information related to a circuit that can be manufactured using the corresponding semiconductor manufacturing technology. For example, the cell can include the layout information which specifies the physical location and the connectivity among different parts (e.g., gate, drain, source, etc.) of a circuit. The cell can also include information about the electrical characteristics, such as the power consumption, speed, and size (i.e., area) of the circuit.

In this disclosure, the terms "placing," "placement," etc. refer to a process that assigns locations to circuit elements in an IC design, and the term "placer" refers to an IC design tool that places circuit elements in an IC design. A placer can try to optimize one or more criteria while placing the circuit elements. For example, a placer may try to minimize the total wire length of the IC design (the total wire length is the sum of the estimated lengths of the electrical connections between different circuit elements in an IC design). How the placer moves through the IC design search space can be influenced by providing the placer with placement guidance.

For example, one way to provide placement guidance is by (1) creating dummy circuit elements in the IC design, (2) placing the dummy circuit elements at random or predetermined locations in the IC design, and (3) creating electrical connections between the actual circuit elements in the IC design and the dummy circuit elements. When the placer tries to minimize the total wire length, the existence of the electrical connections between the actual circuit elements and the dummy circuit elements can change how the circuit elements are placed by the placer. Another example of placement guidance is to provide a bounding box to the placer where the placer is constrained to place certain circuit elements.

In this disclosure, the term "synthesis" refers to a process that converts an RTL representation into a lower level representation (which is sometimes referred to as the "physical design") that includes location information for the gates and registers, and may also include information about other physical characteristics (e.g., area, delay, leakage power, etc.) for the gates and registers. In this disclosure, the term "physical view" refers to a view of the IC design after a placement operation has been performed, i.e., a physical view is a view of the IC design in which the circuit elements have been assigned a location (which may be an initial location, a tentative location, or a final location) in the IC design.

Note that, at the end of step 206, the process has not placed the gates and the registers that are described in the RTL representation. In other words, at this point in the process, the RTL representation describes the electrical interconnections between the logic gates and the registers, but does not include physical location information for the logic gates or registers.

Figure 4:
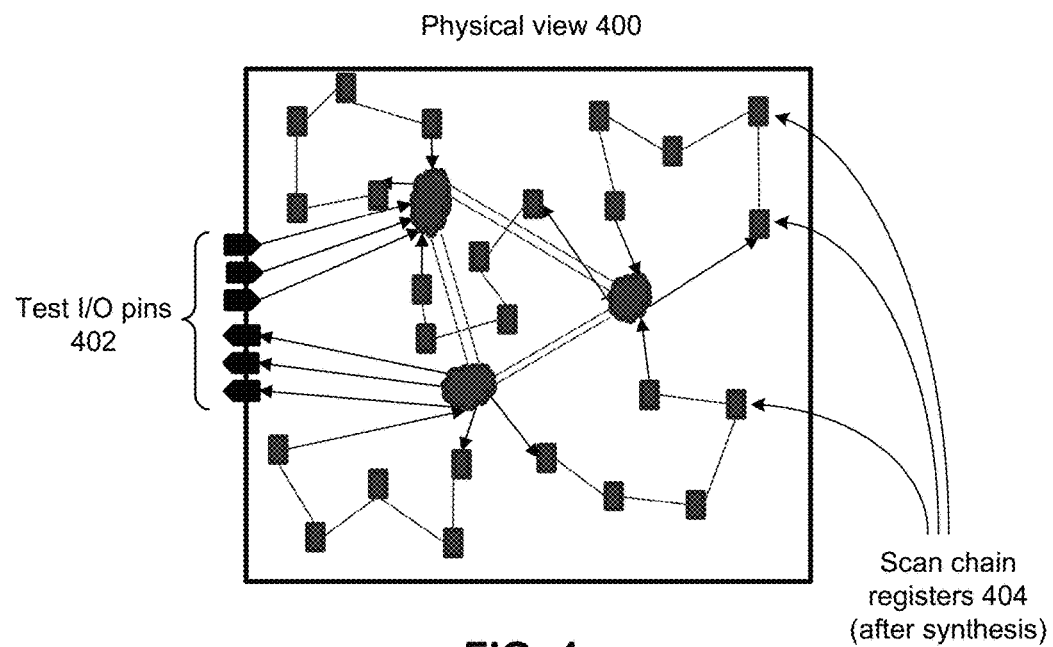
FIG. 4 illustrates a physical view after synthesis in accordance with some embodiments described herein.

Next, the process can perform synthesis on the RTL representation to obtain a synthesized IC design (step 208). Specifically, performing synthesis on the RTL representation can comprise performing a set of operations, which can include: placing the functional logic and the DFT logic, wherein the DFT logic is placed based on the DFT placement guidance (step 208-1), inserting and placing scan chains (step 208-2), and electrically connecting the DFT logic with the scan chains (step 208-3). The terms "inserting scan chains" and "creating scan chains" are used interchangeably in this disclosure. Inserting scan chains involves electrically connecting flip-flops in the IC design in a series fashion to form the scan chains. As mentioned above, the flip-flops that form the scan chains are part of the functional logic, and are placed in step 208-1. However, during scan chain insertion, the synthesis tool may insert additional logic into the IC design (e.g., the additional logic can include lockup/synchronization latches/flip-flops, multi-voltage/isolation cells, etc.). This scan-chain-specific additional logic is placed in step 208-2. FIG. 4 illustrates a physical view after synthesis in accordance with some embodiments described herein. In particular, physical view 400 shows the synthesized IC design after step 208 has been completed. Note that the DFT logic (which is shown by multiple logic clouds) is spread across physical view 400, and is now electrically connected to the scan chain registers, e.g., scan chain registers 404. Note that the DFT logic is not clumped near test I/O pins 402 because the DFT logic was placed based on DFT placement guidance. DFT placement guidance can be generated and provided to the placer using many techniques, and some of these techniques are described below.

DFT Placement Guidance

FIGS. 5A-5D illustrate different techniques by which DFT placement guidance can be generated and provided to a placer in accordance with some embodiments described herein. In FIGS. 5A-5D, the solid rectangles represent registers in the functional logic. Some or all of these registers will be used to form the scan chains during scan chain insertion.

Figure 5A:
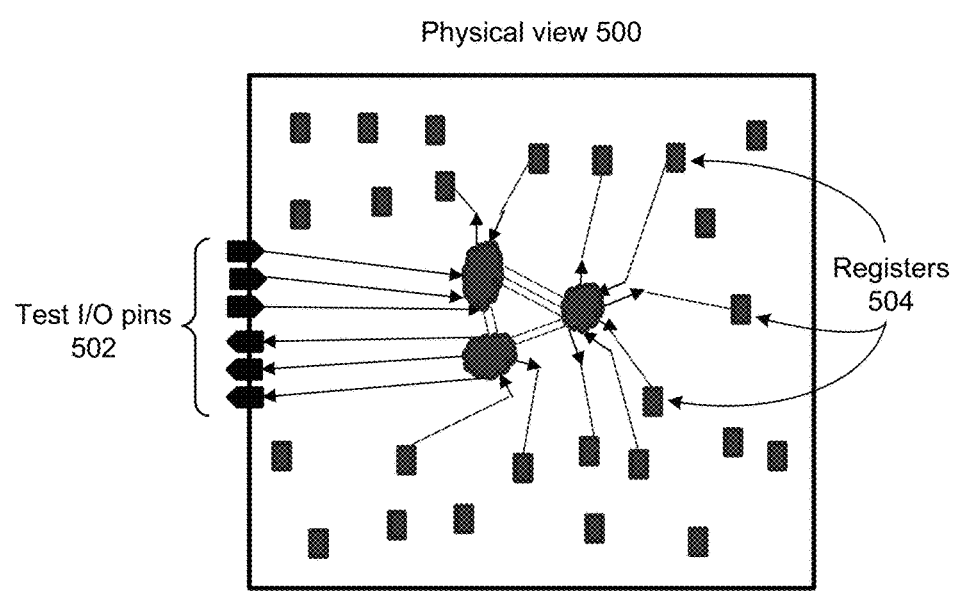
FIGS. 5A-5D illustrate different techniques by which DFT placement guidance can be generated and provided to a placer in accordance with some embodiments described herein.

In the approach shown in FIG. 5A, DFT logic is electrically connected to randomly selected registers in the functional logic, e.g., registers 504 in the functional logic. For example, each output of the decompressor can be electrically connected to an input of a randomly selected register in the functional logic; likewise, each input of the compressor can be electrically connected to an output of a randomly selected register in the functional logic. Next, the functional logic and the DFT logic can be placed (i.e., step 208-1 can be performed). Because the DFT logic was electrically connected to randomly selected registers, the placer is likely to spread the DFT logic out (illustrated in FIG. 5A by the three logic clouds) across physical view 500 instead of clumping the DFT logic near the test I/O pins 502. After the initial placement operation (i.e., step 208-1) has been performed, (1) the DFT logic can be disconnected from the registers, and (2) steps 208-2 and 208-3 can be performed.

Figure 5B:
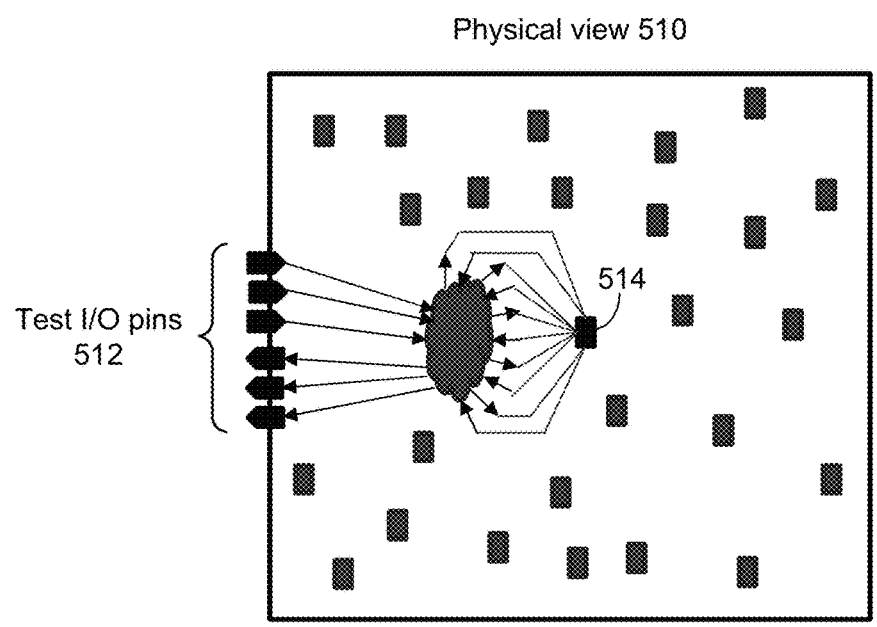

In the approach shown in FIG. 5B, a dummy circuit element 514 (e.g., a dummy macro) is added to the IC design, and the DFT logic is electrically connected to dummy circuit element 514. Dummy circuit element 514 can generally be located at any desired location in the IC design, e.g., dummy circuit element 514 can be located in the center of the IC design area. The location of dummy circuit element 514 can be fixed before initial placement (i.e., step 208-1) is performed. Next, the functional logic and the DFT logic can be placed (i.e., step 208-1 can be performed). Because the DFT logic is electrically connected to dummy circuit element 514 that has a fixed location, the placer is likely to spread the DFT logic out (illustrated in FIG. 5B by the single logic cloud) between the test I/O pins 512 and dummy circuit element 514, instead of clumping it together near test I/O pins 512. After the initial placement operation (i.e., step 208-1) has been performed, (1) the DFT logic can be disconnected from dummy circuit element 514, (2) dummy circuit element 514 can be removed from the IC design, and (3) steps 208-2 and 208-3 can be performed.

Figure 5C:
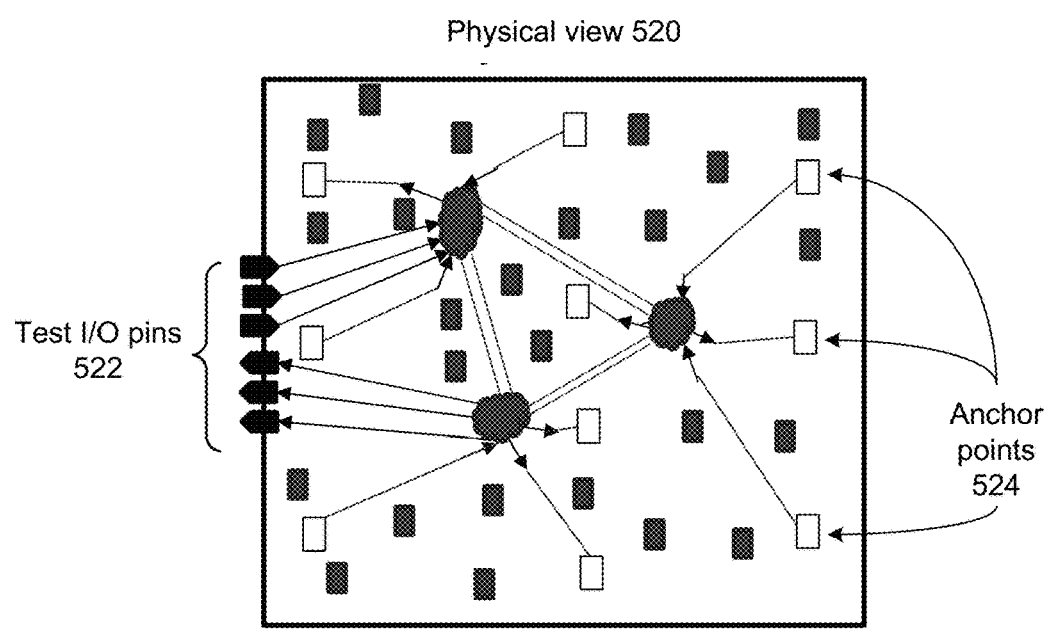

In the approach shown in FIG. 5C, a set of anchor points (e.g., anchor points 524 which are illustrated using unshaded rectangles) are created in the IC design. An anchor point can generally be any circuit element that can be created in the IC design and that can be electrically connected to DFT logic. For example, each anchor point can be a zero area dummy cell that is created solely for the purpose of providing placement guidance to the placer for placing DFT logic. Once the anchor points have been created, the anchor points can be spread out throughout the IC design area. Note that the locations of the anchors points are fixed and will not be changed by the placer. In some embodiments, the anchor points can be spread out in a regular pattern throughout the IC design area. In some embodiments, the anchor points can be spread out in a randomized pattern throughout the IC design area. In some embodiments, the user can provide the locations of some or all of the anchor points in the IC design area. Once the anchor points have been spread out, the DFT logic can be electrically connected to the anchor points. For example, each distinct output of the decompressor can be electrically connected to a distinct anchor point; likewise, each distinct input of the compressor can be electrically connected to a distinct anchor point. Next, the functional logic and the DFT logic can be placed (i.e., step 208-1 can be performed). Because the DFT logic was electrically connected to the anchor points, the placer is likely to spread the DFT logic out (illustrated in FIG. 5C by the three logic clouds) instead of clumping it together near the test I/O pins 522. After the initial placement operation (i.e., step 208-1) has been performed, (1) the DFT logic can be disconnected from the anchor points 524, (2) the anchor points 524 can be removed from the IC design, and (3) steps 208-2 and 208-3 can be performed.

Figure 5D:
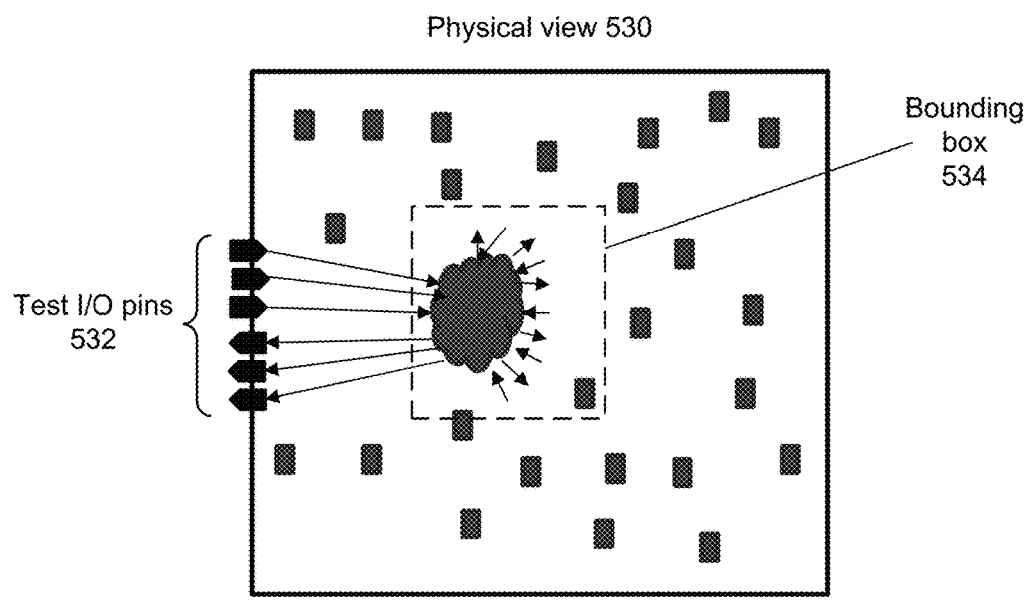

In the approach shown in FIG. 5D, bounding box 534 is created for placing the DFT logic. Bounding box 534 specifies a region in the IC design area where the placer is constrained to place the DFT logic. Next, the functional logic and the DFT logic can be placed (i.e., step 208-1 can be performed). Because the DFT logic was constrained to be placed in bounding box 534, the DFT logic (illustrated in FIG. 5D by the single logic cloud) is not clumped together near test I/O pins 532. After the initial placement operation (i.e., step 208-1) has been performed, (1) bounding box 534 can be removed, and (2) steps 208-2 and 208-3 can be performed.

Experimental results have shown that, in general, the approach for generating DFT placement guidance illustrated in FIG. 5C produces synthesized IC designs that have a better QoR than those that are produced by other approaches. However, it will be appreciated by a practitioner that it is possible for the other approaches to produce better QoR for specific IC designs.

IC Design System

Figure 6:
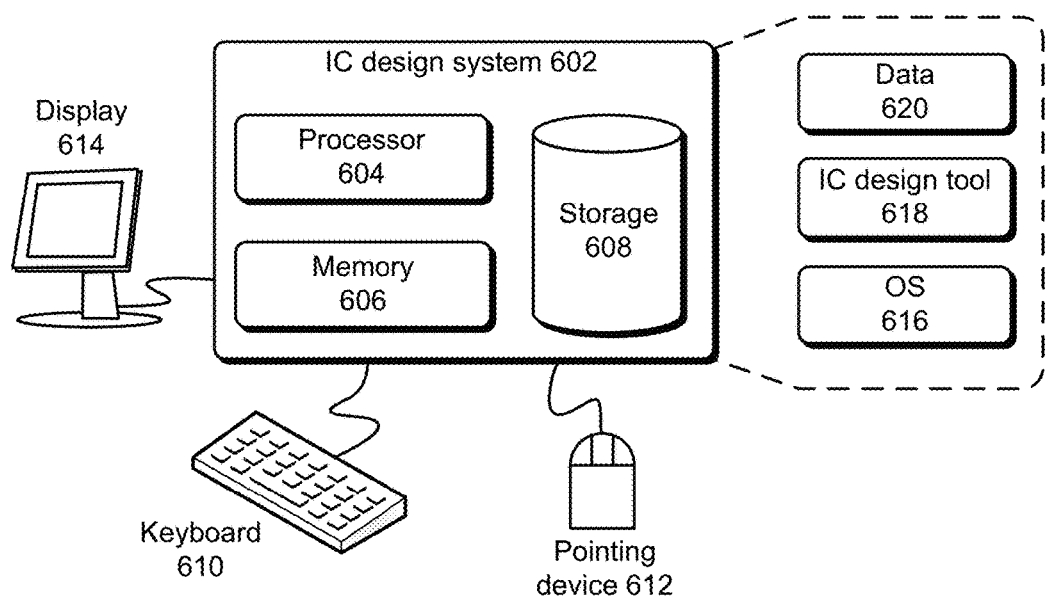
FIG. 6 illustrates an IC design system in accordance with some embodiments described herein.

The term "IC design system" generally refers to a hardware-based system that facilitates designing ICs. FIG. 6 illustrates an IC design system in accordance with some embodiments described herein. IC design system 602 can include processor 604, memory 606, and storage device 608. Specifically, memory locations in memory 606 can be addressable by processor 604, thereby enabling processor 604 to access (e.g., via load/store instructions) and manipulate (e.g., via logical/floating point/arithmetic instructions) the data stored in memory 606. IC design system 602 can be coupled to display device 614, keyboard 610, and pointing device 612. Storage device 608 can store operating system 616, IC design tool 618, and data 620. Data 620 can include input required by IC design tool 618 and/or output generated by IC design tool 618.

IC design system 602 may automatically (or with user help) perform one or more operations that are implicitly or explicitly described in this disclosure. Specifically, IC design system 602 can load IC design tool 618 into memory 606, and IC design tool 618 can then be used to produce a synthesized IC design that includes DFT circuitry.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions for an integrated circuit (IC) design tool that, when executed by a computer, cause the computer to perform a method for producing a synthesized IC design that includes design-for-testability (DFT) circuitry, the method comprising:
   receiving a register-transfer-level (RTL) representation of an IC design that includes functional logic;
   adding DFT logic to the RTL representation;
   adding a set of anchor points to the RTL representation;
   electrically connecting the DFT logic with the set of anchor points; and
   performing synthesis on the RTL representation to obtain the synthesized IC design, wherein said performing synthesis on the RTL representation comprises performing a set of operations, the set of operations including:
   placing the functional logic and the DFT logic,
   electrically disconnecting the DFT logic from the set of anchor points,
   removing the set of anchor points,
   inserting and placing scan chains, and
   electrically connecting the DFT logic with the scan chains; and
   wherein adding the DFT logic to the RTL representation, and placing the DFT logic based on the set of anchor points improves a runtime of the IC design tool and/or a quality of results (QoR) produced by the IC design tool.

2. The non-transitory computer-readable storage medium of claim 1, wherein each anchor point in the set of anchor points is a dummy cell having zero area.

3. The non-transitory computer-readable storage medium of claim 1, wherein prior to said adding the DFT logic to the RTL representation, the RTL representation does not include any DFT logic and also does not include any scan chains.

4. The non-transitory computer-readable storage medium of claim 1, wherein prior to said performing synthesis on the RTL representation, the RTL representation does not include physical location information for the functional logic or the DFT logic.

5. The non-transitory computer-readable storage medium of claim 1, wherein said electrically connecting the DFT logic with the scan chains comprises:
   electrically connecting outputs of decompression logic with inputs of the scan chains; and
   electrically connecting outputs of the scan chains with inputs of compression logic.

6. A method for producing a synthesized integrated circuit (IC) design that includes design-for-testability (DFT) circuitry, the method comprising:
   an IC design tool in a computer receiving a register-transfer-level (RTL) representation of an IC design that includes functional logic;
   the IC design tool in the computer adding DFT logic to the RTL representation;
   adding a set of anchor points to the RTL representation;
   electrically connecting the DFT logic with the set of anchor points; and
   the IC design tool in the computer performing synthesis on the RTL representation to obtain the synthesized IC design, wherein said performing synthesis on the RTL representation comprises performing a set of operations, the set of operations including:
      placing the functional logic and the DFT logic,
      electrically disconnecting the DFT logic from the set of anchor points,
      removing the set of anchor points,
      inserting and placing scan chains, and
      electrically connecting the DFT logic with the scan chains; and
   wherein adding the DFT logic to the RTL representation, and placing the DFT logic based on the set of anchor points improves a runtime of the IC design tool and/or a quality of results (QoR) produced by the IC design tool.

7. The method of claim 6, wherein each anchor point in the set of anchor points is a dummy cell having zero area.

8. The method of claim 6, wherein prior to said adding the DFT logic to the RTL representation, the RTL representation does not include any DFT logic and also does not include any scan chains.

9. The method of claim 6, wherein prior to said performing synthesis on the RTL representation, the RTL representation does not include physical location information for the functional logic or the DFT logic.

10. The method of claim 6, wherein said electrically connecting the DFT logic with the scan chains comprises:
   electrically connecting outputs of decompression logic with inputs of the scan chains; and
   electrically connecting outputs of the scan chains with inputs of compression logic.

11. An apparatus, comprising:
   a processor; and
   a non-transitory computer-readable storage medium storing instructions for an integrated circuit (IC) design tool that, when executed by the processor, cause the apparatus to perform a method for producing a synthesized IC design that includes design-for-testability (DFT) circuitry, the method comprising:
      receiving a register-transfer-level (RTL) representation of an IC design that includes functional logic;
      adding DFT logic to the RTL representation;
      adding a set of anchor points to the RTL representation;
      electrically connecting the DFT logic with the set of anchor points; and
      performing synthesis on the RTL representation to obtain the synthesized IC design, wherein said performing synthesis on the RTL representation comprises performing a set of operations, the set of operations including:
         placing the functional logic and the DFT logic,
         electrically disconnecting the DFT logic from the set of anchor points,
         removing the set of anchor points,
         inserting and placing scan chains, and
         electrically connecting the DFT logic with the scan chains; and
      wherein adding the DFT logic to the RTL representation, and placing the DFT logic based on the set of anchor points improves a runtime of the IC design tool and/or a quality of results (QoR) produced by the IC design tool.

12. The apparatus of claim 11, wherein prior to said adding the DFT logic to the RTL representation, the RTL representation does not include any DFT logic and also does not include any scan chains.

13. The apparatus of claim 11, wherein prior to said performing synthesis on the RTL representation, the RTL representation does not include physical location information for the functional logic or the DFT logic.

14. The apparatus of claim 11, wherein said electrically connecting the DFT logic with the scan chains comprises:
   electrically connecting outputs of decompression logic with inputs of the scan chains; and
   electrically connecting outputs of the scan chains with inputs of compression logic.

* * * * *